(12) United States Patent
You et al.

(10) Patent No.: US 10,903,340 B2
(45) Date of Patent: *Jan. 26, 2021

(54) LATERALLY DIFFUSED METAL OXIDE SEMICONDUCTOR STRUCTURE AND METHOD FOR MANUFACTURING THE SAME

(71) Applicant: Silergy Semiconductor Technology (Hangzhou) LTD, Hangzhou (CN)

(72) Inventors: Budong You, Hangzhou (CN); Hui Yu, Hangzhou (CN); Meng Wang, Hangzhou (CN); Yicheng Du, Hangzhou (CN); Chuan Peng, Hangzhou (CN); Xianguo Huang, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/413,792

(22) Filed: May 16, 2019

(65) Prior Publication Data

US 2019/0363186 A1    Nov. 28, 2019

(30) Foreign Application Priority Data

May 25, 2018    (CN) .......................... 2018 1 0514863

(51) Int. Cl.
*H01L 29/66*    (2006.01)
*H01L 29/06*    (2006.01)
*H01L 29/10*    (2006.01)
*H01L 29/40*    (2006.01)
*H01L 29/78*    (2006.01)

(52) U.S. Cl.
CPC ...... *H01L 29/66681* (2013.01); *H01L 29/063* (2013.01); *H01L 29/1095* (2013.01); *H01L 29/402* (2013.01); *H01L 29/66704* (2013.01); *H01L 29/7816* (2013.01)

(58) Field of Classification Search
CPC ......... H01L 29/66613; H01L 29/66621; H01L 29/66681; H01L 29/66704; H01L 29/78616

See application file for complete search history.

(56) References Cited

U.S. PATENT DOCUMENTS

| 7,018,899 B2 | 3/2006 | Sung |
| 7,074,659 B2 | 7/2006 | Zuniga et al. |
| 7,230,302 B2 | 6/2007 | Lotfi et al. |
| 7,888,222 B2 | 2/2011 | You et al. |

(Continued)

*Primary Examiner* — Eduardo A Rodela
(74) *Attorney, Agent, or Firm* — Michael C. Stephens, Jr.

(57) ABSTRACT

A laterally diffused metal oxide semiconductor structure can include: a base layer; a source region and a drain region located in the base layer; first dielectric layer located on a top surface of the base layer and adjacent to the source region; a voltage withstanding layer located on the top surface of the base layer and located between the first dielectric layer and the drain region; a first conductor at least partially located on the first dielectric layer; and a second conductor at least partially located on the voltage withstanding layer, where the first and second conductors are spatially isolated, and a juncture region of the first dielectric layer and the voltage withstanding layer is covered by one of the first and second conductors.

19 Claims, 8 Drawing Sheets

(56) References Cited

U.S. PATENT DOCUMENTS

| | | |
|---|---|---|
| 7,981,739 B1 | 7/2011 | You et al. |
| 7,999,318 B2 | 8/2011 | Zuniga et al. |
| 8,063,444 B2 | 11/2011 | Chang |
| 8,119,507 B2 | 2/2012 | You |
| 8,293,612 B2 | 10/2012 | Lee |
| 8,319,283 B2 | 11/2012 | Min et al. |
| 8,431,450 B1 | 4/2013 | Zuniga et al. |
| 8,455,340 B2 | 6/2013 | Zuniga et al. |
| 8,574,973 B1 | 11/2013 | You et al. |
| 8,581,344 B2 | 11/2013 | Liu |
| 8,716,790 B2 | 5/2014 | Lotfi et al. |
| 8,716,795 B2 | 5/2014 | You |
| 8,912,600 B2 | 12/2014 | You |
| 2010/0052052 A1 | 3/2010 | Lotfi et al. |
| 2010/0065909 A1* | 3/2010 | Ichijo ............... H01L 29/1095 257/343 |
| 2013/0020632 A1* | 1/2013 | Disney .............. H01L 29/66659 257/328 |
| 2014/0312415 A1* | 10/2014 | Furuhata ...................... 257/335 |
| 2014/0320174 A1 | 10/2014 | Lu et al. |
| 2015/0380398 A1* | 12/2015 | Mallikarjunaswamy .................... H01L 29/0878 257/272 |
| 2017/0263761 A1* | 9/2017 | Hu .................... H01L 29/42376 |
| 2019/0363185 A1* | 11/2019 | You .................. H01L 29/66681 |
| 2019/0363186 A1* | 11/2019 | You ....................... H01L 29/402 |
| 2019/0363187 A1* | 11/2019 | You .................... H01L 29/1095 |
| 2019/0363188 A1* | 11/2019 | You .................. H01L 21/76202 |

\* cited by examiner

US 10,903,340 B2

LATERALLY DIFFUSED METAL OXIDE SEMICONDUCTOR STRUCTURE AND METHOD FOR MANUFACTURING THE SAME

RELATED APPLICATIONS

This application claims the benefit of Chinese Patent Application No. 201810514863.9, filed on May 25, 2018, which is incorporated herein by reference in its entirety.

FIELD OF THE INVENTION

The present invention generally relates to semiconductor devices, and more particularly to laterally diffused metal oxide semiconductor devices and associated methods.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). An output filter, can include an inductor and a capacitor, and may be coupled between the input voltage source and the load to filter the output of the switch, and thus provide the output DC voltage. A controller (e.g., a pulse-width modulator, a pulse frequency modulator, etc.) can control the switch to maintain a substantially constant output DC voltage. Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
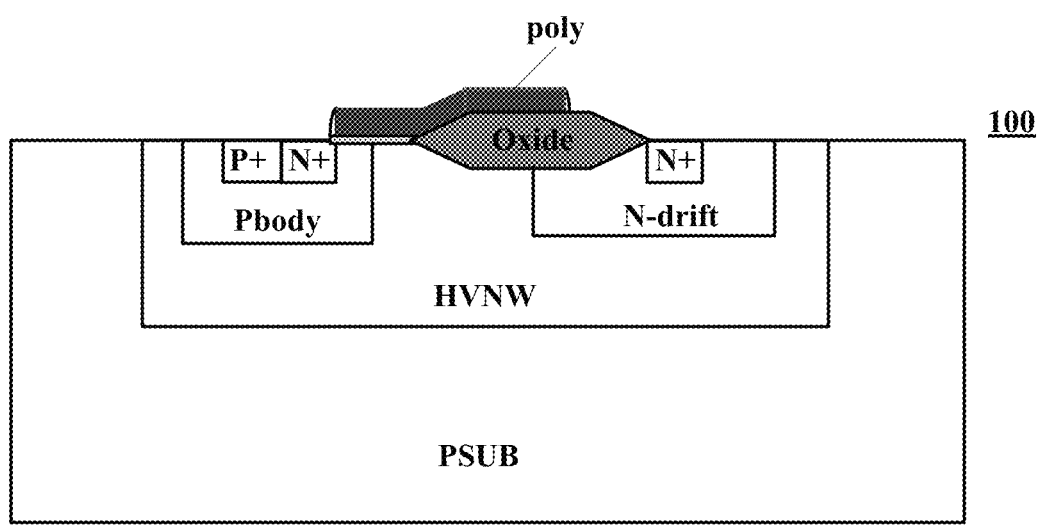
FIG. 1 is a cross-sectional view of an example laterally diffused metal oxide semiconductor structure.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Referring now to FIG. 1, shown is a cross-sectional view of an example laterally diffused metal oxide semiconductor structure. In this example, semiconductor structure 100 can include a P-type substrate PSUB, a high voltage N-type well region HVNW in the P-type substrate PSUB, a P-type body region Pbody, and an N-type drift region N-drift in the high voltage N-type well region HVNW. A source region N+ and a drain region N+ can respectively be formed in P-type body region Pbody and N-type drift region N-drift. A body contact region P+ may also be formed the P-type body region Pbody, and can be arranged in contact with the source region N+. A gate dielectric layer may be arranged on a surface of semiconductor structure 100 and adjacent to the source region. A thick oxide layer Oxide between the gate dielectric layer and the drain region can be arranged on a surface of semiconductor structure 100. A gate conductor poly may cover the gate dielectric layer and extend to the thick oxide layer Oxide.

In semiconductor structure 100, gate conductor can extend from the gate dielectric layer to thick oxide layer Oxide, and the entire conductor layer Poly can act as a gate conductor, which may receive a control voltage controlling the turn-on/off of semiconductor structure 100 through the gate electrode. Therefore, when semiconductor structure 100 is in the off state, the potential on thick oxide layer Oxide may not assist in depleting the N-type drift region N-drift, and the high-voltage breakdown performance of the device may not be maintained. Further, the gate electrode can extend above the N-type drift region N-drift, and the overlap between the gate region and the drain region can be relatively large, such that the gate charge Qgd is relatively large, and the high frequency application of semiconductor structure 100 may accordingly be limited.

In one embodiment, a laterally diffused metal oxide semiconductor structure can include: (i) a base layer; (ii) a source region and a drain region located in the base layer; (iii) a first dielectric layer located on a top surface of the base layer and adjacent to the source region; (iv) a voltage withstanding layer located on the top surface of the base layer and located between the first dielectric layer and the drain region; (v) a first conductor at least partially located on the first dielectric layer; and (vi) a second conductor at least partially located on the voltage withstanding layer, where the first and second conductors are spatially isolated, and a juncture region of the first dielectric layer and the voltage withstanding layer is covered by one of the first and second conductors.

Figure 2:
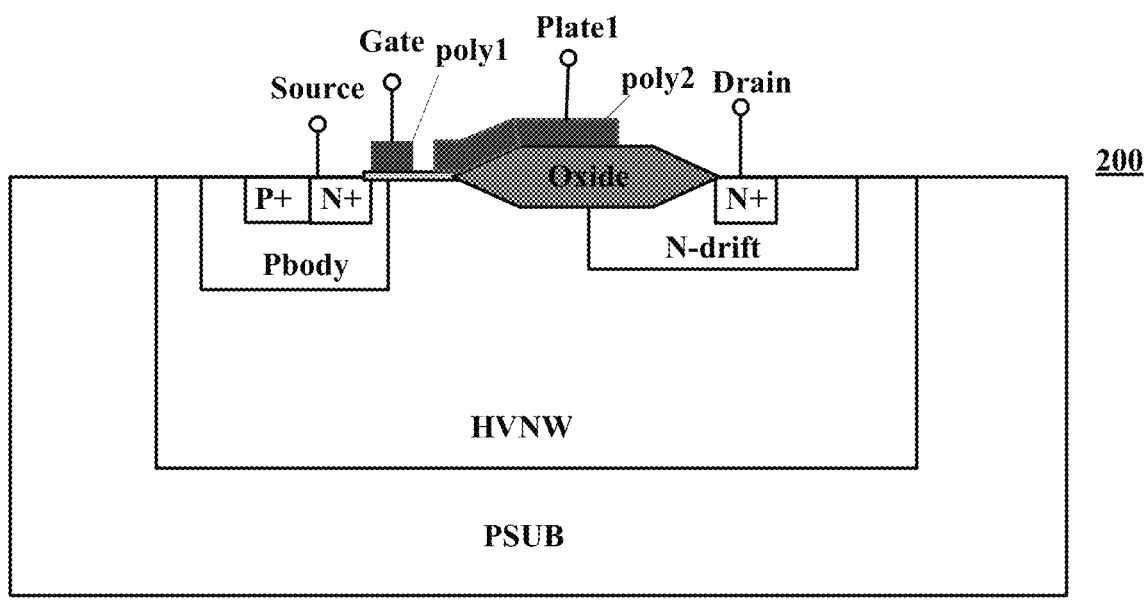
FIG. 2 is a cross-sectional view of a first example laterally diffused metal oxide semiconductor structure, in accordance with embodiments of the present invention.

Referring now to FIG. 2, shown is a cross-sectional view of a first example laterally diffused metal oxide semiconductor structure, in accordance with embodiments of the present invention. In this particular example, semiconductor structure 200 can include a base layer, a source region, a drain region, a first dielectric layer, and a voltage withstanding layer. The source region and the drain region may be located in the base layer. The first dielectric layer can be located on the top surface of the base layer and adjacent to the source region. The voltage withstanding layer may be located on the top surface of the base layer and between the first dielectric layer and the drain region. Semiconductor structure 200 may also include a first conductor on the first dielectric layer, and a second conductor on the voltage withstanding layer. The first and second conductors can be spatially isolated, and a juncture of the first dielectric layer and the voltage withstanding layer may be covered by one of the first and second conductors, such that only the first dielectric layer or the voltage withstanding layer is exposed at the disconnection position between the first and second conductors.

In semiconductor structure 200, the source region and the drain region may both be N-type doped N+ regions. In other examples, the source region and the drain region may also be P-type doped P+ regions. The base layer can include P-type substrate PSUB and N-type high voltage well region HVNW located in substrate PSUB. In other examples, the base layer may only include a semiconductor substrate. The first dielectric layer may serve as a gate dielectric layer, and the first conductor can be a gate conductor for electrically connecting the gate electrode Gate (indicated by the connection terminal in FIG. 2). The first dielectric layer may be an oxide layer (e.g., a SiO2 layer), and the first conductor may be a polysilicon layer Poly1 located on the first dielectric layer. The voltage withstanding layer may be a local oxidation of silicon (LOCOS) dielectric layer, such as thick oxide layer Oxide. Thick oxide layer Oxide may be a bird's beak shape, where the thickness of the voltage withstanding layer is greater than the thickness of the first dielectric layer.

The second conductor may be polysilicon layer Poly2 located on one side of the first conductor and extending from a surface of the first dielectric layer to a surface of the voltage withstanding layer, such that the second conductor covers a juncture region between the first dielectric layer and the voltage withstanding layer. That is, only the first dielectric layer may be exposed at the disconnected positions of the first and second conductors, such that the source electrode of semiconductor structure 200 is closer to the disconnected position. This is advantageous for assisting the depletion of the bird's beak region and increasing the voltage withstanding performance of the structure, while the electric field in the bird's beak region can be reduced, and hot carrier characteristics of semiconductor structure 200 can be improved. Further, the overlap between the first conductor and the drain portion (where the drain region is located) may be shortened due to the disconnected position only exposing the first dielectric layer. Thus, gate charge Qgd of semiconductor structure 200 can be effectively reduced, such that semiconductor structure 200 may be suitable for high frequency applications.

The first and second conductors may be spatially isolated, whereby the spatial isolation is that the first and second conductors are not in contact with each other in space, and are separated from each other. The second conductor can be electrically connected to field plate electrode Plate1 (indicated by the connection terminal in FIG. 2). Field plate electrode Plate1 can be connected to the same potential as source electrode Source. That is, the field plate electrode Plate1 may be electrically connected to source electrode Source, or field plate electrode Plate1 may be connected to other potentials separately, and field plate electrode Plate1 can connect to a different potential from gate electrode Gate. Since field plate electrode Plate1 and gate electrode Gate can connect to different potentials, when the potential connected to the gate electrode Gate causes semiconductor structure 200 to be in an off state, field plate electrode Plate1 may still assist in depleting the drift region by receiving a certain potential, in order to maintain high voltage withstanding of semiconductor structure 200.

Semiconductor structure 200 can also include a drift region and a body region in the base layer. The drain region may be located in the drift region, and at least a portion of the withstand voltage layer can be located on the drift region. The source region can be located in the body region, and at least a portion of the first dielectric layer may be located on the body region. The doping type of the body region may be different from the doping type of the source region. For example, an N-type source region can be located in a P-type doped body region Pbody, and may be electrically connected to source electrode Source (indicated in FIG. 2 by a connection terminal). The drift region and the drain region may have the same doping type. For example, a doping concentration of an N-doped drift region N-drift can be less than that of drain region N+, and drain region N+ can be electrically connected to drain electrode Drain (indicated in FIG. 2 by a connection terminal). Body region Pbody may serve as a channel region of semiconductor structure 200, and at least a portion of the first dielectric layer can cover body region Pbody. A portion of drift region N-drift may be located below voltage withstanding layer Oxide, and drift region N-drift may extend as far as possible to body region Pbody to block lateral diffusion of the body region Pbody toward the drain region N+.

Figure 3:
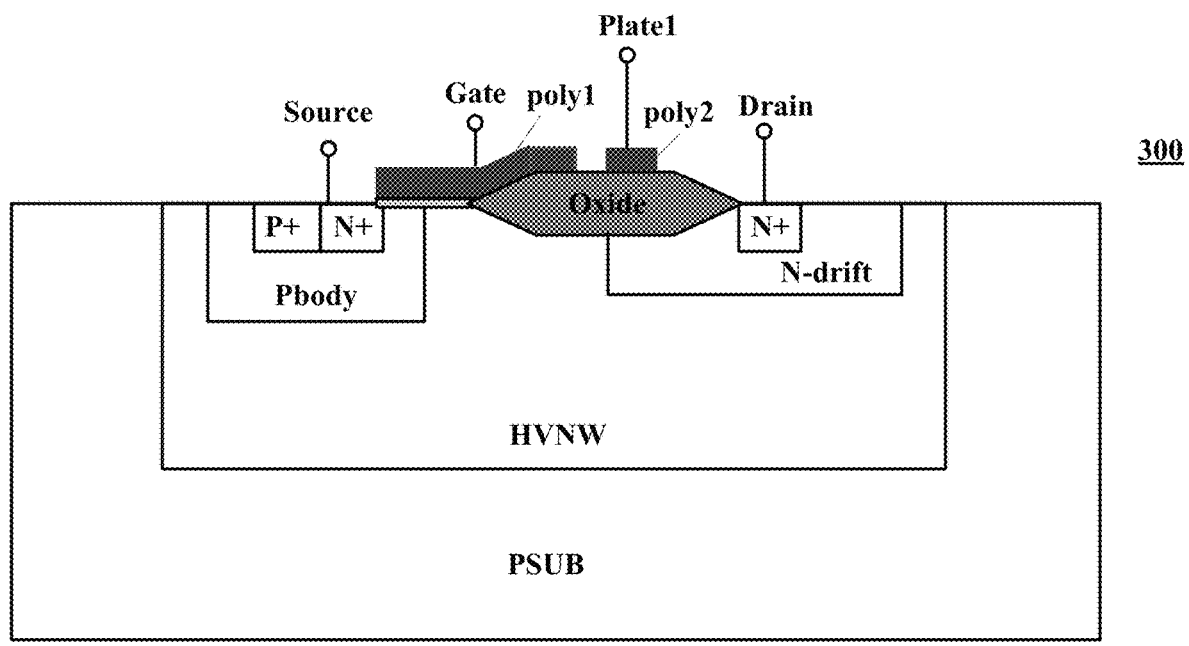
FIG. 3 is a cross-sectional view of a second example laterally diffused metal oxide semiconductor structure, in accordance with embodiments of the present invention.

Referring now to FIG. 3, shown is a cross-sectional view of a second example laterally diffused metal oxide semiconductor structure, in accordance with embodiments of the present invention. Semiconductor structure 300 may differ from semiconductor structure 200 in the first and second conductors. In semiconductor structure 300, the first and second conductors can respectively be polysilicon Poly1 and polysilicon Poly2. The first conductor may extend from the surface of the first dielectric layer to the surface of the voltage withstanding layer. That is, the juncture region of the first dielectric layer and the voltage withstanding layer can be covered by the first conductor, thereby the gate charge Qgd of semiconductor structure 300 may be decreased. The second conductor may only be located on the voltage withstanding layer, and only the voltage withstanding layer can be exposed at the disconnected positions of the first and second conductors.

Figure 4:
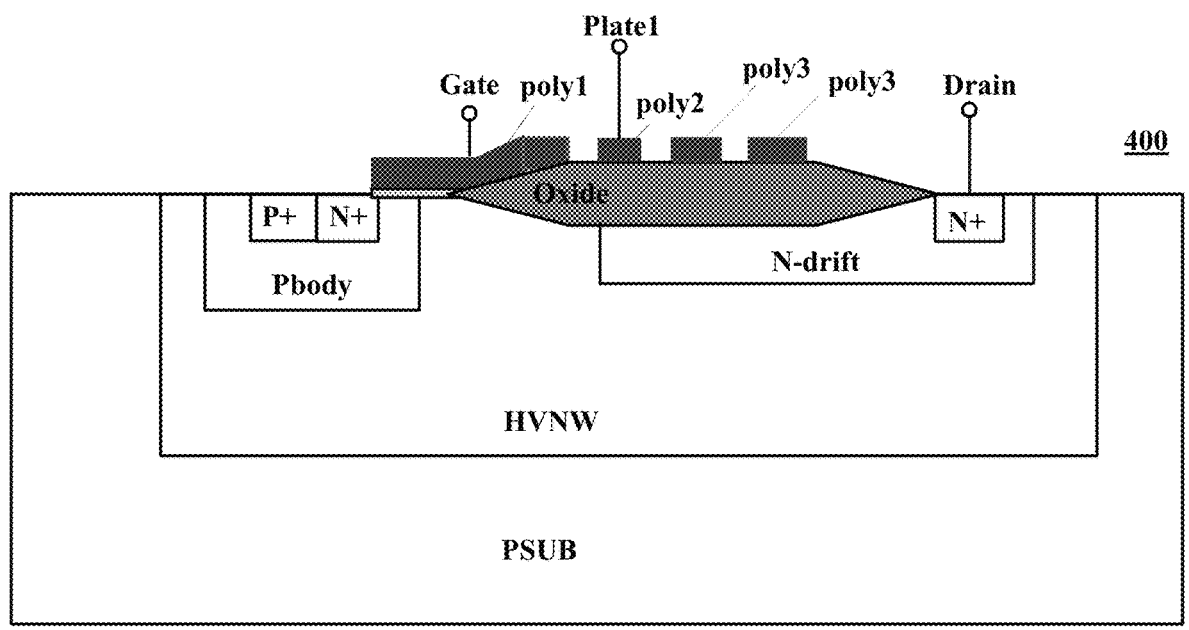
FIG. 4 is a cross-sectional view of a third example laterally diffused metal oxide semiconductor structure, in accordance with embodiments of the present invention.

Referring now to FIG. 4, shown is a cross-sectional view of a third example laterally diffused metal oxide semiconductor structure, in accordance with embodiments of the present invention. Semiconductor structure 400 may differ from semiconductor structure 300 in that it further includes at least one third conductor. The third conductor(s) can be located on voltage withstanding layer Oxide, may be spatially isolated from each other, and third conductor adjacent to the second conductor can be spatially isolated from the second conductor. In semiconductor structure 400, the third conductor layer may be polysilicon Poly3, and each of polysilicon Poly3 can be electrically connected to corresponding one of second field plate electrodes. Also, the potential of each of the second field plate electrodes may be different from that of first field plate electrode Plate1. The closer polysilicon Poly3 is to the drain region N+, the higher potential polysilicon Poly3 may have, and the voltage withstanding performance of the device can be further improved. In addition, a resistor may be disposed between second field plate electrode adjacent to first field plate electrode and first field plate electrode Plate1, and/or a resistor may be disposed between the adjacent second field plate electrodes.

Figure 5:
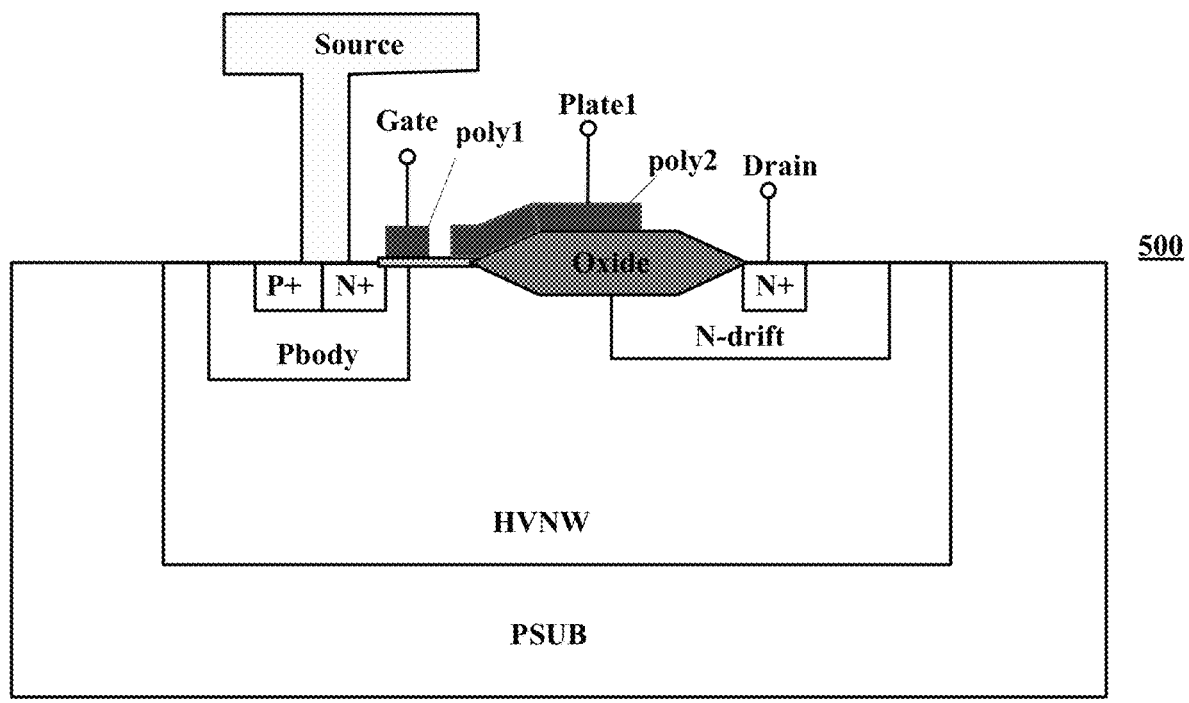
FIG. 5 is a cross-sectional view of a fourth example laterally diffused metal oxide semiconductor structure, in accordance with embodiments of the present invention.

Referring now to FIG. 5, shown is a cross-sectional view of a fourth example laterally diffused metal oxide semiconductor structure, in accordance with embodiments of the present invention. Semiconductor structure 500 may be substantially the same as semiconductor structure 200, but can include a specific structure of source electrode Source. In this particular example, source electrode Source can be electrically connected to the source region, and may extend at least to above the second conductor (e.g., polysilicon Poly2) such that the first dielectric layer and/or the voltage withstanding layer Oxide located between the first and second conductors are covered by the source electrode Source. That is, the space between the first conductor and the second conductor may be covered by the source electrode Source, whereby source electrode Source may not be directly in contact with first dielectric layer and/or the voltage-withstanding layer, but rather can be a non-contact covering (e.g., source electrode Source is located above the first dielectric layer and/or the voltage-withstanding layer). The electric field at the disconnected position of the first and second conductors may drop, and in the semiconductor structure 500, the space between the first and second conductors can be covered by the source electrode Source without contact in order to avoid the dropping phenomenon, thereby improving the voltage withstanding performance of semiconductor structure 500. Similarly, the source electrode structure in semiconductor structure 500 can be employed in semiconductor structures 300 and/or 400.

Figure 6:
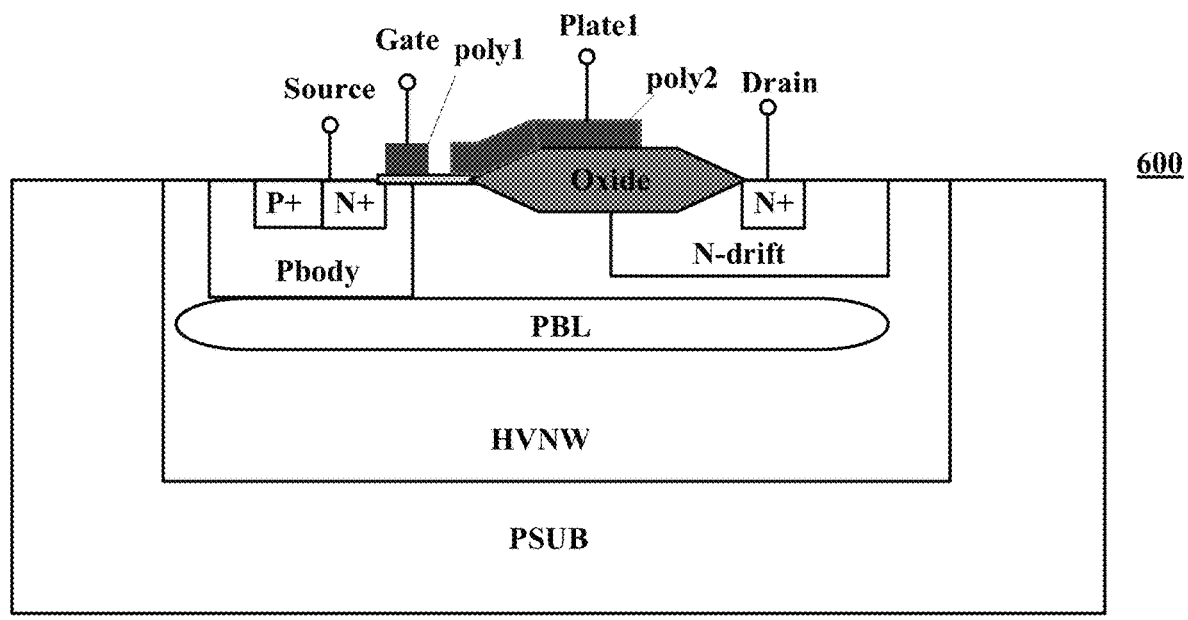
FIG. 6 is a cross-sectional view of a fifth example laterally diffused metal oxide semiconductor structure, in accordance with embodiments of the present invention.

Referring now to FIG. 6, shown is a cross-sectional view of a fifth example laterally diffused metal oxide semiconductor structure, in accordance with embodiments of the present invention. Semiconductor structure 600 may be substantially the same as the semiconductor structure 200 except that semiconductor structure 600 may further include a reduced surface field effect layer in the base layer. A lower surface of the body region and a lower surface of the drift region may not be lower than an upper surface of the reduced surface field effect layer. In other examples, the semiconductor device may not include the drift region, and a lower surface of the drain region may not be lower than an upper surface of the reduced surface field effect layer. The doping type of the reduced surface field effect layer may be the same as that of the body region and different from that of the drift region.

The reduced surface field effect layer can be used to assist in depleting the drift region such that when the drift region has a higher doping concentration, it can still be quickly depleted to reduce the surface electric field of semiconductor device 600. Thus, semiconductor device 600 may have both low on-resistance (Rdson) and a high breakdown voltage (BV). In order to further reduce on-resistance Rdson of semiconductor device 600, the first spacing distance between the upper of the reduced surface field effect layer and the lower surface of the drift region may be set to be greater than zero. That is, there can be a certain space between the reduced surface field effect layer and the drift region in order to supply electrons to flow through. In addition, in order to better adjust the voltage withstanding characteristic of semiconductor device 600, the first spacing distance can be adjusted according to the doping concentration of the drift region. The larger the doping concentration of the drift region, the more the auxiliary depletion of the reduced surface field effect layer may be needed and the smaller the first spacing distance, and vice versa. In semiconductor device 600, the reduced surface field effect layer may be a P-type buried layer PBL formed in N-type high voltage well region HVNW.

In order to provide sufficient dopant of first type (e.g., the first doping type is P-type, and the dopant of first type is P-type dopant) at a position closer to the surface of semiconductor device 600, the second spacing distance between the upper surface of the reduced surface field effect layer and the lower surface of the body region can be set to be less than or equal to the first spacing distance, in order to better assist in deplete the region near the drain region to reduce the surface electric field of the region. In semiconductor device 600, the lower surface of the body region can be closer to the upper surface of the reduced surface field effect layer than the lower surface of the drift region. Body region Pbody may be P-type, and N-type source region N+ can be located in body region Pbody. The source region can be electrically connected to source electrode Source (shown as a connection terminal in FIG. 2). In semiconductor device 600, the reduced surface field effect layer can be a P-type buried layer PBL, in order to ensure that the first spacing distance is greater than or equal to the second spacing distance, in a first direction, the junction depth of the drift region may be smaller than the junction depth of the body region. The first direction refers to a stacking direction of the reduced surface field effect layer and the drift region. The reduced surface field effect layer in semiconductor device 600 can also be employed in semiconductor devices 300, 400, and/or 500.

Figure 7:
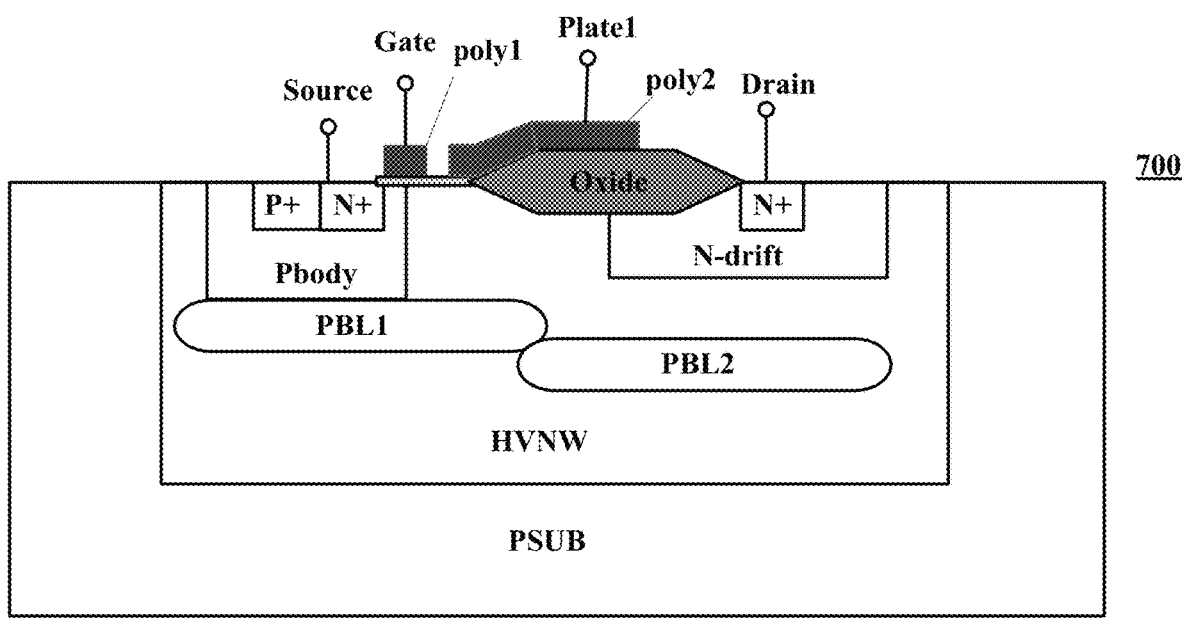
FIG. 7 is a cross-sectional view of a sixth example laterally diffused metal oxide semiconductor structure, in accordance with embodiments of the present invention.

Referring now to FIG. 7, shown is a cross-sectional view of a sixth example laterally diffused metal oxide semiconductor structure, in accordance with embodiments of the present invention. Semiconductor device 700 may differ from semiconductor device 600 in that the spacing distance between the upper surface of the reduced surface field effect layer (the side close to the drift region) and the top surface of the base layer may not be a constant value. For example, the third spacing distance between the upper surface of the reduced surface field effect layer located below the body region and the top surface of the base layer can be less than a fourth spacing between the upper surface of the reduced surface field effect layer located below the drift region and the top surface of the base layer. The reduced surface field effect layer located below the body region may be as close as possible to the body region to reduce the surface electric field and improve the breakdown voltage of semiconductor device 700. There can be a space between the upper surface of the reduced surface field effect layer and the lower surface of the drift region to reduce on-resistance of semiconductor device 700 by the greatest extent.

In semiconductor device 700, the reduced surface field effect layer may be composed of first and second buried layers located in the base layer, where the first and second buried layers are in contact with each other. At least a portion of the first buried layer can be located below the body region, and at least a portion of the second buried layer is located below the drift region. A spacing distance between the upper surface of the first buried layer and the top surface of the base layer is a third spacing distance, and a spacing distance between the upper surface of the second buried layer and the top surface of the base layer is a fourth spacing distance. The first buried layer can be a P-type buried layer PBL1, and the second buried layer may be a P-type buried layer PBL2. Buried layer PBL1 may be disposed as close as possible to the P-type body region Pbody. For example, buried layer PBL1 and P-type body region Pbody can be in direct contact. A voltage of the source electrode applied to body region Pbody (the reference ground voltage) may be applied to PBL1 through the body region to avoid dynamic Rdson from occurring, while buried layer PBL2 may not be in contact with drift region N-drift. That is, the first spacing distance may be greater than zero, in order to provide a wider current path for the electrons, and to further reduce the Rdson of semiconductor device 700. The reduced surface field effect layer in semiconductor device 700 can also be applied to semiconductor devices 300, 400, and/or 500.

Figure 8:
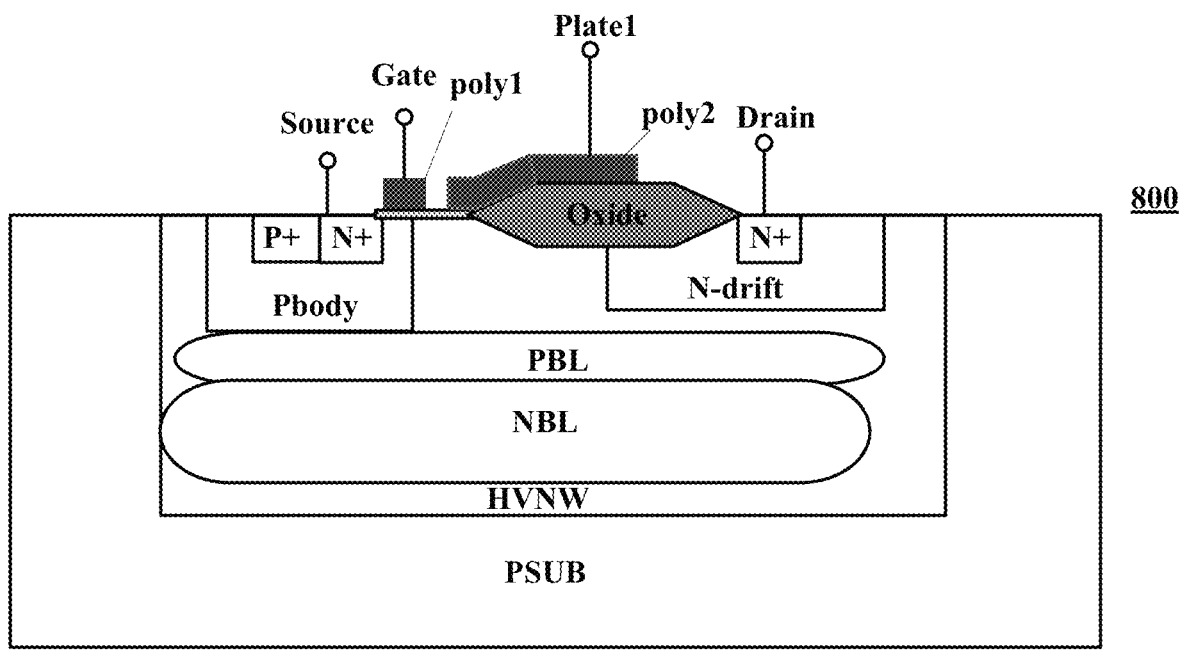
FIG. 8 is a cross-sectional view of a seventh example laterally diffused metal oxide semiconductor structure, in accordance with embodiments of the present invention.

Referring now to FIG. 8, shown is a cross-sectional view of a seventh example laterally diffused metal oxide semiconductor structure, in accordance with embodiments of the present invention. Semiconductor device 800 may differ from semiconductor device 600 in that semiconductor device 800 can further include an isolation layer located in the base layer and below the reduced surface field effect layer. The isolation layer may isolate the reduced surface field effect layer from the bottom portion of the base layer in order to facilitate high voltage applications of semiconductor device 800. In this particular example, the isolation layer may be third buried layer NBL of the N-type doped located in high voltage well HVNW and located below buried layer PBL. The doping concentration of the third buried layer NBL can be heavier than that of the high voltage well HVNW. Similarly, the isolation layer described in semiconductor device 800 may be disposed below the reduced surface field effect layer in semiconductor device 700.

In particular embodiments, a method of manufacturing a laterally diffused metal oxide semiconductor structure can include forming a source region and a drain region in a base layer, and forming a first dielectric layer on a top surface of the base layer. The first dielectric layer may be adjacent to the source region. The method can also include forming a voltage withstanding layer on the top surface of the base layer between the first dielectric layer and the drain region, and forming a conductor layer on the first dielectric layer and the voltage withstanding layer. The method can also include forming a first conductor at least partially located on the first dielectric layer and a second conductor at least partially located on voltage withstanding layer by etching the conductor layer. The first and second conductors can be spatially isolated, and a juncture region of the first dielectric layer and the voltage withstanding layer may be covered by one of the first and second conductors.

In particular embodiments, high voltage well region HVNW can be formed in semiconductor substrate PSUB, and base layer can include high voltage well region HVNW and semiconductor substrate PSUB. A field oxide layer may then be formed using a LOCOS process, and voltage withstanding layer Oxide may be formed using the LOCOS process after limiting the high-voltage drain region with a mask. The drift region and the reduced surface field effect layer can also be formed. Further, after forming the reduced surface field effect layer, the method can also include forming an isolation layer (e.g., an NBL layer) in the base layer. The isolation layer may be located below the reduced surface the field effect layer, in order to isolate the reduced surface field effect layer from a bottom portion of the base layer.

The method can also include forming a first dielectric layer, as shown in FIGS. 2-8. That is, a gate dielectric layer, and then a conductor layer (e.g., a polysilicon layer) may be deposited on the first dielectric layer and voltage withstanding layer Oxide. The deposited conductor layer can be etched to form first, second, and third conductors. For example, the first dielectric layer may be adjacent to the source region. After forming the first and second conductors, a body region (e.g., a P-type body region) can be formed. A lightly doped drain (LDD) region, such as an n-type lightly doped region NLDD region, may be formed in the body region (e.g., P-type body region) by an implanting process. The second spacing distance between the lower surface of the body region and the upper surface of the reduced surface field effect layer may be less than or equal to the first spacing distance between the lower surface of the drift region and the upper surface of the reduced surface field effect layer.

After forming the body region and the lightly doped region, sidewalls spacers can be formed at the both sides surface of the first, second, and/or third conductor of FIGS. 2-8. In addition, a source region and a drain region may respectively be formed in the body region and the drift region. Further, a source electrode, a drain electrode, a gate electrode, and field plate electrodes can be formed. When the source electrode is formed, the source electrode may extend at least to above the second conductor. For example, before forming the source electrode, an interlayer dielectric layer may be formed on the top surface of the base layer. The source region can be exposed by the interlayer dielectric layer, and the source electrode may include a first portion in contact with the source region through the interlayer dielectric layer, and a second portion located on a surface of the interlayer dielectric layer and extending at least to above the voltage withstanding layer.

In addition, when forming the reduced surface field effect layer, the first spacing distance can be adjusted according to the doping concentration of the drift region. For example, the higher the doping concentration of the drift region, and the smaller the first spacing distance. A reduced surface field effect layer having two P-type buried layers may be formed (see, e.g., FIG. 3) by using two masks. In addition, a third spacing distance between the upper surface of the reduced surface field effect layer located below the body region and the top surface of the base layer can be less than a fourth spacing distance between the upper surface of the reduced surface field effect layer located below the drift region and the top surface of the base layer.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A laterally diffused metal oxide semiconductor structure, the semiconductor structure comprising:
   a) a base layer;
   b) a source region and a drain region located in the base layer;
   c) a first dielectric layer located on a top surface of the base layer and adjacent to the source region;
   d) a voltage withstanding layer located on the top surface of the base layer and located between the first dielectric layer and the drain region;
   e) a first conductor at least partially located on the first dielectric layer; and
   f) a second conductor at least partially located on the voltage withstanding layer,
   g) wherein the first and second conductors are spatially isolated, and a juncture region of the first dielectric layer and the voltage withstanding layer is covered by one of the first and second conductors,
   h) wherein the first conductor is only located on the first dielectric layer, and the second conductor extends from a surface of the voltage withstanding layer to a surface of the first dielectric layer to cover the juncture region of the first dielectric layer and the voltage withstanding layer.

2. The semiconductor structure according to claim 1, wherein the first conductor extends from a surface of the first dielectric layer to a surface of the voltage withstanding layer to cover the juncture region of the first dielectric layer and the voltage withstanding layer, and the second conductor is only located on the voltage withstanding layer.

3. The semiconductor structure according to claim 1, wherein the first conductor is configured as a gate electrode, and the second conductor is configured as a first field plate electrode, wherein the first field plate electrode and the gate electrode are coupled to different potentials.

4. The semiconductor structure according to claim 3, further comprising a source electrode electrically connected to the source region, wherein the first field plate electrode and the source electrode are coupled to the same potential.

5. The semiconductor structure according to claim 4, wherein the source electrode extends at least to above the second conductor.

6. The semiconductor structure according to claim 1, further comprising at least one third conductor, wherein the at least one third conductor is located on the voltage withstanding layer, each third conductor is spatially isolated from each other, and the third conductor adjacent to the second conductor is spatially isolated from the second conductor.

7. The semiconductor structure according to claim 6, further comprising a plurality of second field plate electrodes that each are electrically connected to a corresponding one of the third conductors.

8. The semiconductor structure according to claim 1, wherein the voltage withstanding layer is a second dielectric layer, and a thickness of the second dielectric layer is greater than that of the first dielectric layer.

9. The semiconductor structure according to claim 1, further comprising a drift region and a body region located in the base layer, wherein:
 a) the drain region is located in the drift region;
 b) at least a portion of the voltage withstanding layer is located on the drift region;
 c) the source region is located in the body region; and
 d) at least a portion of the first dielectric layer is located on the body region.

10. The semiconductor structure according to claim 9, further comprising a reduced surface field effect layer located in the base layer, wherein a lower surface of the body region and a lower surface of the drift region are not lower than a upper surface of the reduced surface field effect layer, and a doping type of the reduced surface field effect layer is the same as that of the body region and different from that of the drift region.

11. The semiconductor structure according to claim 10, wherein the first spacing distance between an upper surface of the reduced surface field effect layer and a lower surface of the drift region is greater than zero, and the second spacing distance between the upper surface of the reduced surface field effect layer and a lower surface of the body region is less than or equal to the first spacing distance.

12. The semiconductor structure according to claim 10, further comprising an insulation layer located in the base layer and located below the reduced surface field effect layer, wherein the reduced surface field effect layer and a bottom portion of the base layer are isolated by the insulation layer.

13. A method of manufacturing a laterally diffused metal oxide semiconductor structure, the method comprising:
 a) forming a source region and a drain region in a base layer;
 b) forming a first dielectric layer on a top surface of the base layer, wherein the first dielectric layer is adjacent to the source region;
 c) forming a voltage withstanding layer on the top surface of the base layer and between the first dielectric layer and the drain region;
 d) forming a conductor layer on the first dielectric layer and the voltage withstanding layer; and
 e) forming a first conductor at least partially located on the first dielectric layer and a second conductor at least partially located on voltage withstanding layer by etching the conductor layer,
 f) wherein the first and second conductors are spatially isolated, and a juncture region of the first dielectric layer and the voltage withstanding layer is covered by one of the first and second conductors,
 g) wherein the first conductor is only located on the first dielectric layer, and the second conductor extends from a surface of the voltage withstanding layer to a surface of the first dielectric layer to cover the juncture region of the first dielectric layer and the voltage withstanding layer.

14. The method according to claim 13, further comprising:
 a) forming a gate electrode electrically connected to the first conductor; and
 b) forming a first field plate electrode electrically connected to the second conductor, wherein the first field plate electrode and the gate electrode are coupled to the different potentials.

15. The method according to claim 14, further comprising forming a source electrode electrically connected to the source region, wherein the source electrode extends at least to above the second conductor, and the first field plate electrode and the source electrode are coupled to the same potential.

16. The method according to claim 13, wherein when forming the first and second conductors, the method further comprises forming at least one third conductor on the voltage withstanding layer, wherein each third conductor is spatially isolated from each other, and the third conductor adjacent to the second conductor is spatially isolated from the second conductor.

17. The method according to claim 16, further comprising forming a plurality of second field plate electrodes that each are electrically connected to a corresponding one of the third conductors.

18. The method according to claim 13, further comprising forming a drift region, a body region, and a reduced surface field effect layer in the base layer, wherein:
 a) the drain region is located in the drift region, and at least a portion of the voltage withstanding layer is located on the drift region;
 b) the source region is located in the body region, and at least a portion of the first dielectric layer is located on the body region; and
 c) the reduced surface field effect layer is located below the body region and the drift region, and a doping type of the reduced surface field effect layer is the same as that of the body region and different from that of the drift region.

19. The method according to claim 18, further comprising forming an isolation layer below the reduced surface field effect layer, wherein the reduced surface field effect layer and a bottom portion of the base layer is isolated by the isolation layer.

* * * * *